United States Patent [19]
Nakajima et al.

[11] Patent Number: 5,999,236
[45] Date of Patent: Dec. 7, 1999

[54] ACTIVE-MATRIX LIQUID CRYSTAL DISPLAY UNIT IN WHICH GATE AND/OR DATA LINES ARE MADE OF CR CONTAINING NE-ATOMS

[75] Inventors: Katsunori Nakajima, Hitachi; Kenichi Onisawa, Hitachinaka; Kenichi Chahara, Hitachi; Mitsuhiro Kamei, Takahagi, all of Japan

[73] Assignee: Hitachi, Ltd., Tokyo, Japan

[21] Appl. No.: 08/972,199

[22] Filed: Nov. 18, 1997

[30] Foreign Application Priority Data

Nov. 18, 1996  [JP]  Japan .................................... 8-306390

[51] Int. Cl.$^6$ .................... G02F 1/136; G02F 1/1343; H01L 29/04
[52] U.S. Cl. ................. 349/43; 349/139; 349/148; 257/59; 257/72
[58] Field of Search .............. 349/43, 139, 143, 349/147, 148; 257/59, 72; 438/648, 683, 685

[56] References Cited

U.S. PATENT DOCUMENTS

| | | | |
|---|---|---|---|
| 5,552,909 | 9/1996 | Onisawa et al. | 359/59 |
| 5,668,379 | 9/1997 | Ono et al. | 257/59 |
| 5,739,877 | 4/1998 | Onisawa et al. | 349/42 |
| 5,760,854 | 6/1998 | Ono et al. | 349/38 |
| 5,777,702 | 7/1998 | Wakagi et al. | 349/47 |
| 5,831,694 | 11/1998 | Onisawa et al. | 349/43 |

*Primary Examiner*—William L. Sikes
*Assistant Examiner*—Tarifur R. Chowdhury
*Attorney, Agent, or Firm*—Antonelli, Terry, Stout & Kraus, LLP

[57] ABSTRACT

An active-matrix liquid crystal display unit in which gate lines and drain lines disposed around a TFT device and a transparent pixel electrode are formed by a metal film including Ne atoms in a Cr film so as to provide a resistivity of 22 $\mu\Omega$cm or below for the metal film and an absolute value of 200 MPa or below for the film stress.

16 Claims, 6 Drawing Sheets

ACTIVE-MATRIX LIQUID CRYSTAL DISPLAY UNIT IN WHICH GATE AND/OR DATA LINES ARE MADE OF CR CONTAINING NE-ATOMS

BACKGROUND OF THE INVENTION

1. Field of the Invention

The present invention relates to an active-matrix liquid crystal display unit, particularly to an active-matrix liquid crystal display unit suitable for driving a liquid crystal by a thin-film transistor (TFT).

2. Description of Related Art

In TFT driving systems of excellent image quality generally used as active-matrix liquid crystal display units, a largest demand is price cutting thereof. Thus, it is essential to reduce the cost of fabrication process of the TFT-LCD (liquid crystal display) unit to which amorphous silicon is applied, to cut down the number of fabrication processes and to improve the throughput and fabrication yield. Recently, for the purpose of improving the throughput in the fabrication line of liquid crystal display units, glass substrates having the sizes of 470 mm×370 mm from which four 10.4-inch panels can be taken, and 650 mm×550 mm from which six 12.1-inch panels can be taken. In this case, in order to reduce the weight of liquid crystal display units, the conventional thickness of the glass substrates of 1.1 mm has been reduced to 0.7 mm or below although the sizes of the glass substrate have been increased. Thus, in the fabrication process in which the glass substrates of increased size are used, there is a case of an occurrence of a bending in the glass substrate itself during a process of transferring this glass substrate. A stress of a thin film including a metal film for signal lines is one of factors for causing the bending of the glass substrate itself.

Further, not only the price cutting but also progress in a higher resolution and a larger diagonal screen are demanded in the liquid crystal display unit. Resistance of signal lines increases when the line length is increased or the line width is reduced, and payasific capacitance also increases along with an increase in the number of line cross sections and an increase in the number of transistors connected to the lines. When a display unit is structured in the state of an increased number of signal lines and parasific capacitance, a time constant to be determined by the product of the resistance of signal lines and the parasific capacitance increases, and the image quality is deteriorated due to a dull waveform of the driving pulse. Therefore, a metal material of low resistivity is required for the lines of a TFT-LCD unit.

Under the above circumstances, as a metal line material for a TFT-LCD unit, an Mo-W alloy of low resistance around 20 $\mu\Omega$cm has been proposed, as described in the Japanese Patent Application Laid-open Publication No. 6-317814. When this alloy is used as the line material, a tapered section is formed at the edge of the line, without a formation of a protrusion such as a void at the line edge, by a dry etching method. This improves the step-coverage at the time of forming other film on this line.

Prior-art technique have had problems that the cost of material of a target to be used for a sputtering method for forming this alloy thin film is extremely expensive since the Mo-W alloy thin film is used as the line material, the throughput of the dry etching method is low, and a dry etching unit is expensive. Thus, it is difficult to lower the price of the liquid crystal display unit according to the prior-art technique.

Al or an Al alloy may be used as a line material considering its low resistivity and low price and being able to be processed by a wet etching method for high throughput. However, if Al or Al alloy is used as the line material, a hillock (protrusion) is generated by the heat applied during a fabrication process, with a resultant risk of an occurrence of a short-circuiting between lines. In order to use Al or Al alloy as the line material, it is necessary to anodize a film or to laminate the film with other metal of high melting point. This rather increases the process cost along with an increase in the number of processes.

Cr can be processed by the wet etching method without a risk of an occurrence of a hillock, and is excellent in its adhesiveness with other film and its lower contact resistance. Cr is used as a line material as described, for example, in the Japanese Patent Application Laid-open Publication No. 5-188397. However, Cr has a problem that the film stress is extremely high within the range of the normal sputtering conditions. If the film thickness is increased in order to lower the resistivity, the bending of the substrate becomes larger along with an increase in the film thickness, with a resultant risk that there arises a defect in the substrate during its transfer and the substrate is broken if the substrate has a hurt on it. The simply use of Cr as the line material is difficult to achieve a high resolution and a larger diagonal screen of the liquid crystal display unit. The use of Ne as an inert gas for the sputtering is also considered as disclosed in the Japanese Patent Application Laid-open Publication No. 6-67214. The mere use of Ne still has a problem that it is difficult to make the resistivity smaller or to make the film stress smaller.

SUMMARY OF THE INVENTION

It is an object of the present invention to provide an active-matrix liquid crystal display unit which can make both the resistivity and the film stress of the elements smaller for structuring a signal transmission path, and a method for fabricating this unit.

According to an active-matrix liquid crystal display unit, this unit includes a liquid crystal layer including a crystal liquid for structuring a plurality of pixels, a pair of insulation substrates oppositely disposed to sandwich the liquid crystal layer therebetween, with at least one of these insulation substrates being transparent, a plurality of scanning lines disposed in dispersion on one of the pair of insulation substrates, and a plurality of data signal lines disposed to cross in a matrix shape with the plurality of scanning lines, wherein, in a plurality of display areas encircled by the plurality of scanning lines and the plurality of data signal lines, there are provided auxiliary electrodes to be applied with a liquid crystal driving voltage and semiconductor active elements for driving the pixels connected to the scanning lines and the data signal lines, and an element for constituting a signal transmission path for transmitting an electrical signal relevant to the driving of the semiconductor active elements for driving the pixels is structured by a metal film including Ne atom in a Cr film, with resistivity of the metal film being equal to or lower than 22 $\mu\Omega$cm and with an absolute value of the film stress of the metal film being equal to or lower than 200 MPa.

The element for constituting the signal transmission path may also be applied to at least one of the scanning lines and the data signal lines.

Further, preferably, the edge of the metal signal lines is formed with a tapered section of 60° or below. Also, the film thickness of the metal film may be 250 nm or above.

According to one aspect of the present invention, an element for constituting a signal transmission path for transmitting an electrical signal relevant to the driving of a semiconductor active element for driving a pixel is a Cr film, and the film thickness is within a range from 200 nm to 400 nm, the ratio of an average crystal grain size to the film thickness viewed from a direction perpendicular to the film plane is 0.18 or larger than that and an X-ray diffraction intensity ratio of a (200) plane to a (110) plane of a film is 2 or larger.

According to a fabrication method of an active-matrix liquid crystal display unit of the present invention, Cr is used as a cathode target and is inserted into a sputtering gas including Ne as an inert gas or a mixture gas of Ar and Ne, and a metal film including Ne atom in the Cr film is formed by a DC magnetron sputtering method, with resistivity of this metal film being equal to or lower than 22 $\mu\Omega$cm and with an absolute value of the film stress of the metal film being equal to or lower than 200 MPa.

In this fabrication method, a background pressure is set to be equal to or lower than $1 \times 1.0^{-4}$ Pa, a gas pressure of the sputtering gas is set at a value between 0.4 and 1.0 Pa and a power density is set to be equal to or above 10 W/cm$^2$ to thereby deposit the metal film.

According to another aspect of the fabrication method of the present invention, Cr is used as a main material of at least one of the scanning lines and the data signal lines, and is inserted into a sputtering gas including Ne as an inert gas or a mixture gas of Ar and Ne by the use of the Cr as cathode target, and a metal film is formed by a DC magnetron sputtering method, to have a film thickness within a range from 200 nm to 400 nm, with a ratio of an average crystal grain size to the film thickness viewed from a direction perpendicular to the film plane being 0.18 or larger and with an X-ray diffraction intensity ratio of a (200) plane to a (110) plane of a film being 2 or larger.

According to the present invention, at the time of forming an element for the signal transmission lines, the scanning lines and the data lines as a metal film including Ne atom in the Cr film, the sputtering gas pressure is adjusted to an optimum level so that a metal film is formed with its resistivity being equal to or lower than 22 $\mu\Omega$cm and with an absolute value of the film stress being equal to or lower than 200 MPa. Accordingly, it becomes possible to form a metal film with a low resistivity and a low film stress as an element for the signal transmission lines, the scanning lines or the data lines. Thus, it becomes possible to minimize the bending of a substrate and to improve the fabrication yield of substrates.

BRIEF DESCRIPTION OF THE DRAWINGS

These and other objects, features and advantages of the present invention will be understood more clearly from the following detailed description with reference to the accompanying drawings, wherein.

DESCRIPTION OF THE PREFERRED EMBODIMENTS

One mode of implementation of the present invention will be explained below with reference to drawings.

Figure 1:
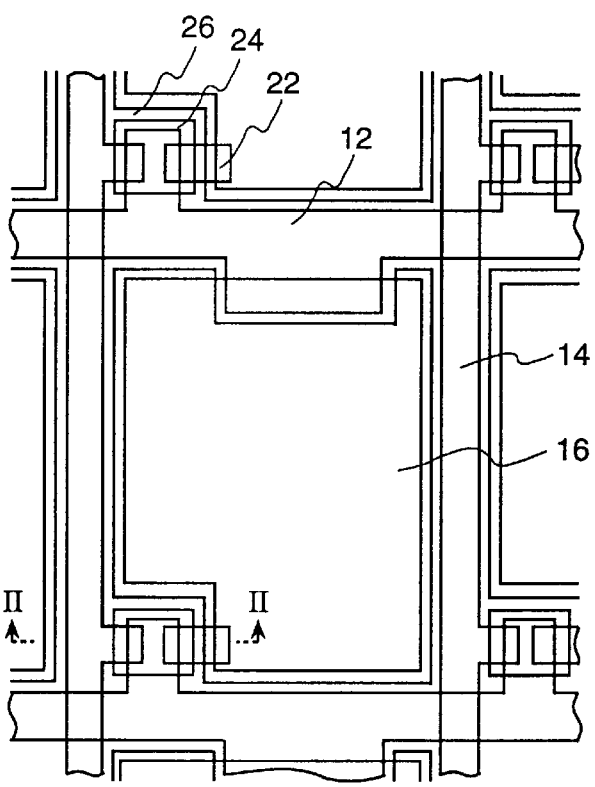
FIG. 1 is a top plan schematic view for showing a structure of one pixel component of a liquid crystal display unit for showing one mode of implementation of the present invention.
Figure 2:
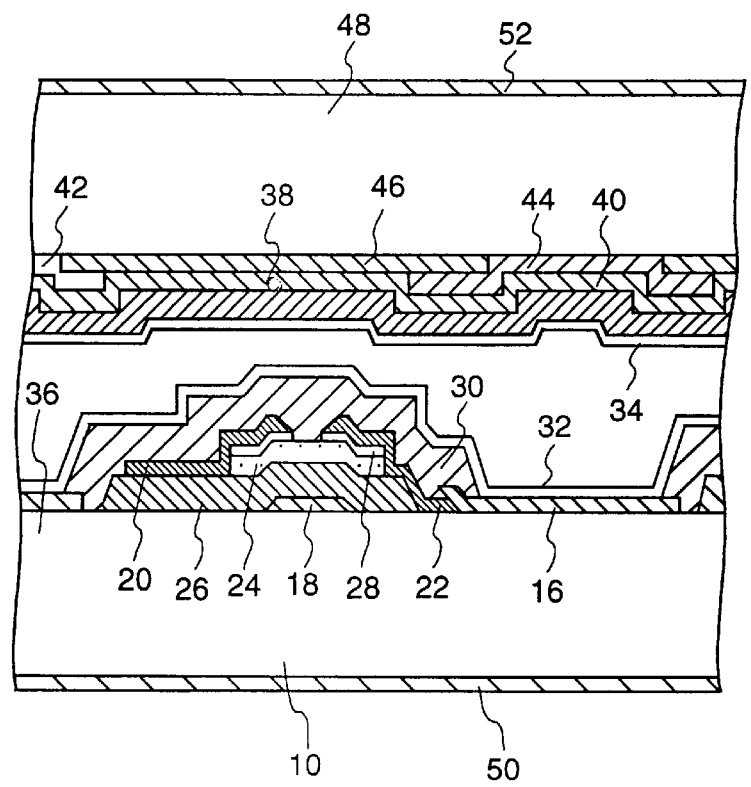
FIG. 2 is a cross sectional diagram for showing a portion cut along a II—II line in FIG. 1.

FIG. 1 is a top plan schematic view for showing a structure of one pixel in a TFT substrate mounted on an active-matrix liquid crystal display unit and FIG. 2 is a cross sectional diagram cut along a II—II line in FIG. 1. Referring to FIG. 1 and FIG. 2, a plurality of gate (scanning) lines 12 and a plurality of drain(data) lines 14 are laid out in a matrix shape sandwiching an insulator on a glass substrate 10. In a display unit of a type called a VGA (Video Graphic Array) used for a personal computer, 480 gate lines 12 are laid out in a vertical direction and 640×3 (red, green and blue) drain lines 14 are laid out in a lateral direction. A transparent pixel electrode 16 is formed in a display area encircled by the gate lines 12 and the drain lines 14. In each of the display areas, a TFT device (a semiconductor active element for driving a pixel) is formed on the glass substrate 10 adjacent to the transparent pixel electrode 16. The TFT device includes a gate electrode 18, a drain electrode 20, a source electrode 22, a semiconductor electrode 24, etc. The gate electrode 18 is formed on the glass substrate 10, and a gate insulator 26 is formed on the gate electrode 18. A semiconductor device layer 24 and a n+.-Si film 28 are formed on the gate insulator 26. A drain electrode 20 and a source electrode 22 are formed across by sandwiching a semiconductor layer 24. A passivation film 30 is formed on the TFT device. An alignment film 32 is formed on the passivation film 30. Opposite to this alignment film 32, an alignment film 34 is formed such that a liquid crystal layer 36 is inserted between the alignment films 32 and 34. On the alignment film 34, a transparent electrode ITO layer 38 as an opposite electrode (common electrode) to be applied with a liquid crystal driving voltage is formed. A color filter is formed on the ITO layer 38 through a passivation film 40. The color filter has elements of a blue color 42, a green color 44 and a red color (not shown), and this color filter is connected with a black matrix 46 for shielding a light. A glass substrate 48 is laminated on this black matrix 46. Polarizing filters 50 and 52 are connected to the outside of the substrates 10 and 48 respectively. There are three kinds of the black matrix 46; one formed by a black colored resin, one formed by a metal Cr and one formed by a laminated film of a metal Cr and a Cr oxide. Each of these kinds of black matrix is formed by photolithography. The color filter is classified into four kinds according to a forming unit, including a dyeing method, a pigment dispersion method, a printing method and an electro-deposition method.

In fabricating a liquid crystal display panel, layers are laminated on the glass substrate 10 up to the alignment film 32, and are laminated on the glass substrate 48 up to the alignment film 34. Before adhering both substrates, a spacer is coated uniformly on the surfaces of these substrates in order to make constant the distance (cell gap) between the substrates. Thereafter, both substrates 10 and 48 are adhered together in alignment. A thermoset epoxy resin is coated on peripheral area of the surface to adhere the substrates. Then, a liquid crystal is injected into the cell between the alignment films 32 and 34. Thereafter, the injection opening is sealed with an epoxy resin. Subsequently, the gate lines 12, the drain lines 14, a common electrode and a driving circuit in the circumference of the substrates 10 and 48 are connected by using an anisotropic conductive film, and the polarizing filters 50 and 52 are placed to the surfaces of the cells. A back light unit is installed on the rear side of the TFT substrate, thus completing a liquid crystal display unit.

As an element for constituting a signal transmission path for transmitting an electrical signal relevant to the driving of a TFT device (semiconductor active element for driving a pixel), the present invention is characterized in that the gate lines (scanning lines) 12 and the drain lines (data lines) 14, are formed by a metal film including Ne atom in a Cr film. A result of various investigations carried out for extracting this characteristic will be explained below.

At first, the influence of sputtering conditions affected to the resistivity of the Cr film will be explained.

Figure 3:
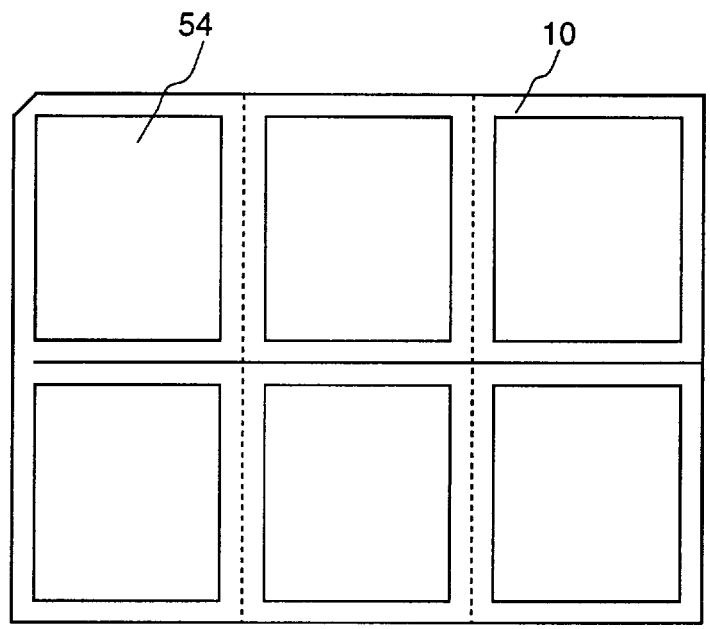
FIG. 3 is a structure diagram of a glass substrate.

For deposition of films, DC magnetron sputtering apparatuses which is featured by a simple operation with good reproducibility and high expected throughput level have been used. When operating these sputtering apparatuses, firstly a space formed by opposing a material (target: cathode) to be formed as a-film and the substrate 10 (anode) is exhausted to a vacuum, then an inert gas is introduced into this space, a DC voltage is applied to both the material and the substrate to generate a plasma, and a phenomenon of sputtering of the target by a generated cation is utilized for a deposition of a film on the substrate. Magnetron is used for increasing the plasma density and for improving the deposition rate, and is disposed at the rear side of the target. In this case, as the glass substrate 10, a substrate of the sizes 550 mm×650 mm with a thickness of 0.7 mm has been used to deposit a Cr film on the substrate 10, as shown in FIG. 3. In order to enable a processing of the glass substrate 10 at a higher throughput level, a cluster-type sputtering apparatus as shown in FIG. 4 has been used.

In a liquid crystal process (to be described later) after the TFT process, the glass substrate 10 is cut into six panels along broken lines in FIG. 3, with a screen 54 of each panel having a diagonal size of 12.1 inches. In a manufacturing process, a plurality of the glass substrates 10 are accommodated within a cassette 62 moved by a transfer robot 60. After having been installed in a transfer stage 64 by a transfer operation of the robot 60, the cassette 62 is transferred to a first loading/unloading chamber 68 or to a second loading/unloading chamber 70. These chambers are exhausted to a vacuum state and the glass substrates 10 within the chamber are moved one by one to a heating chamber 72. The glass substrate 10 is heated to a predetermined temperature in the heating chamber 72, and is then transferred to a first deposition chamber 74. The glass substrate 10 transferred to the first chamber 74 is coated with a Cr film by sputtering. According to the present embodiment, Ne is used instead of Ar conventionally used as an inert gas for the sputtering.

The second glass substrate 10 after being heated is transferred to a second deposition chamber 76 so that a film is deposited on the glass substrate 10 by sputtering. Thereafter, a film is further deposited on the third glass substrate 10 in a third deposition chamber in a similar manner. The transfers of the glass substrate 10 during this period are performed by a vacuum transfer robot 80. In each of these chambers for film deposition, the gate lines 12, the drain lines 14, the electrodes of the TFT devices, etc. are deposited. After finishing the film deposition, the substrate 10 is returned to the first loading/unloading chamber 68 or to the second loading/unloading chamber 70, and is moved to the transfer stage 64 by a transfer robot 66, thereafter, moved to another process by the transfer robot 60.

Figure 4:
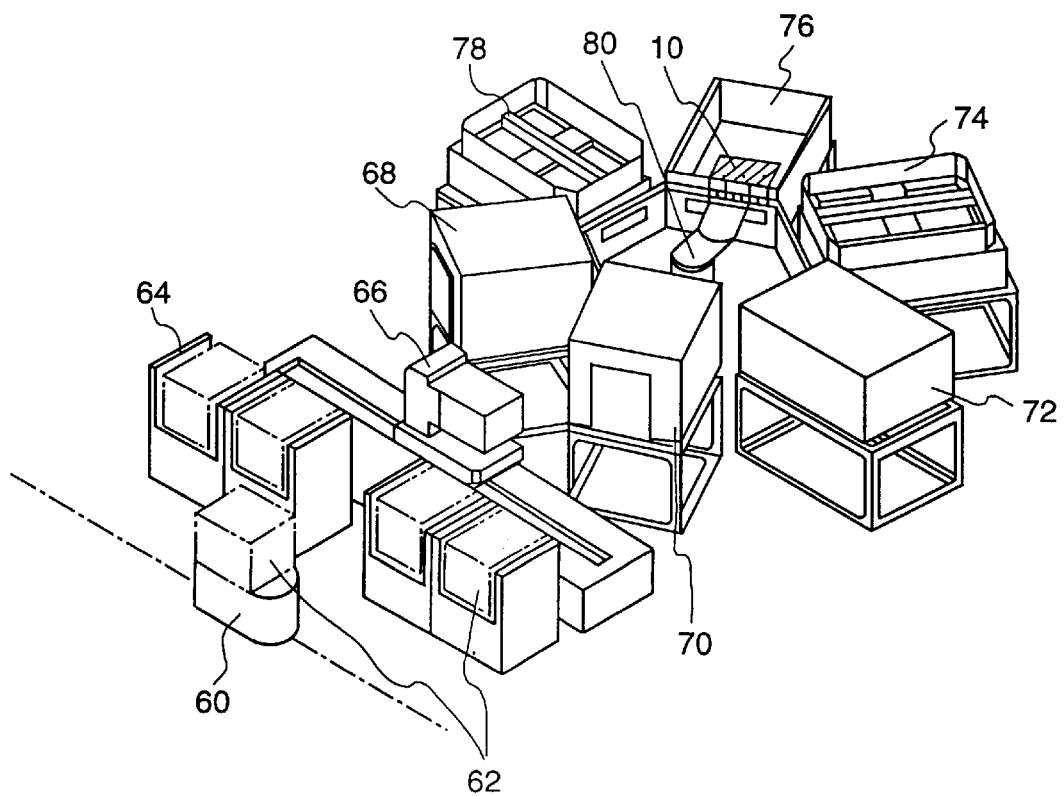
FIG. 4 is a perspective view for showing a structure of cluster-type sputtering apparatuses.

The cluster-type sputtering apparatus as shown in FIG. 4 has several advantages; to be applied to the processes of a plurality of kinds of targets, to enhanced a fabrication throughput, to decrease a foot point for the apparatus, and to make the maintenance easier. The apparatus structure of moving a magnet disposed at the rear side of the target provides a higher power density as compared with the conventional in-line type sputtering apparatus.

Figure 5:
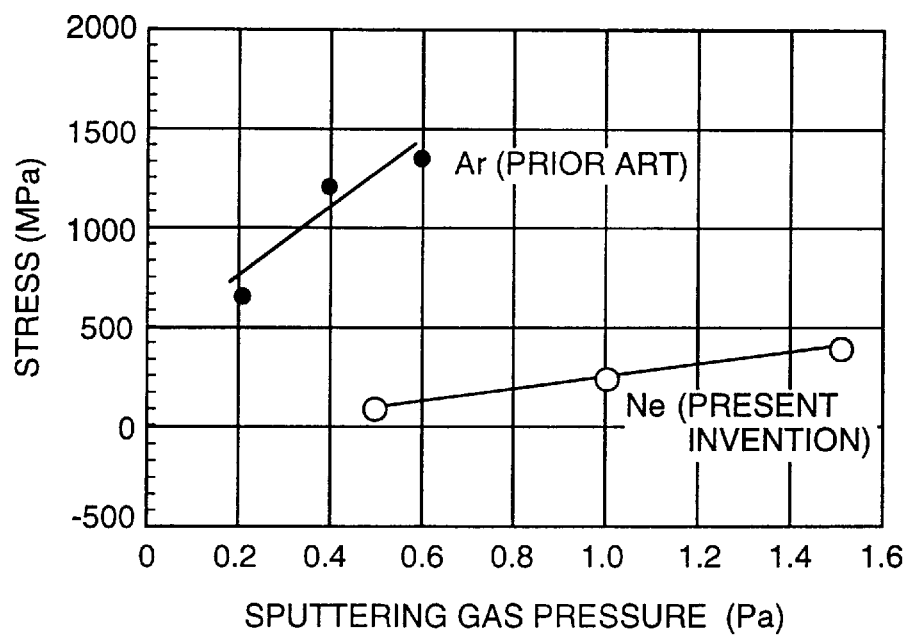
FIG. 5 is a characteristic diagram for showing a relationship between a sputtering gas pressure and a stress.
Figure 6:
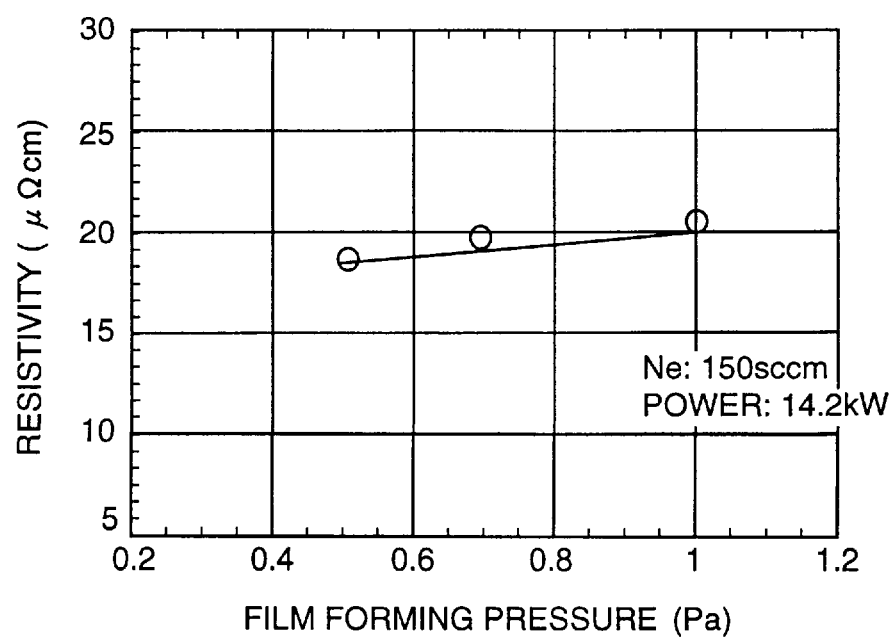
FIG. 6 is a characteristic diagram for showing a relationship between a sputtering gas pressure and resistivity.

A film stress and resistivity of the metal film deposited by the above-mentioned sputtering have been measured and results as shown in FIG. 5 and FIG. 6 were obtained. In this measurement, electric resistance (sheet resistance) has been obtained by a four-points probe resistance measuring method, and resistivity has been calculated from a film thickness obtained by measuring a height of a film edge formed by etching the film. Further, by using silicon wafer (5 inches in diameter and 0.55 mm in thickness) a difference of bending quantity δ of the wafers between before and after the film deposition was measured. A film stress has been calculated by using the following expression which represents a relationship between this bending quantity difference δ and a film stress σ.

$$\delta = 3(1-\gamma)l^2 d\sigma/E.b \qquad (1)$$

where, E: Young's modulus, γ: Poisson's ratio of the substrate, l: length (diameter) of the substrate, b: thickness of the substrate, d: film thickness.

When Ar is used as an inert gas for the sputtering, it has been clarified that although the resistivity of Cr can be lowered to around 22 $\mu\Omega$cm or below, a tensile stress of at least 700 to 800 MPa is generated in the film under any conditions of film deposition, and this causes the glass substrate to be bent resulting in a trouble in the handling of the substrate. In the worst case, the substrate is broken to bring about a deterioration of the fabrication yield and a stop in the operation. In the case of a substrate with a larger bending quantity, there arose such a problem that the pattern resolution is deteriorated even in the exposure and developing processes after the sputtering process. Furthermore, in the areas such as source/drain pants where a film should cover the unevenness of the underlayer well, line disconnection failures occurred in many cases due to high film stress of Cr. FIG. 5 indicates that although the film stress is reduced along with a reduction in the sputtering gas pressure, the film stress is as high as approximately 700 Mpa even at 0.2 Pa which is a lower limit where a plasma is sustained. Although it may be expected that the stress can be lowered to 700 Mpa or below when the pressure is set lower than 0.2 Pa, it is actually difficult to generate a plasma under the condition of excessively lower density of gas molecules.

When Ne is used as a sputtering gas, results of investigation are shown in FIGS. 5 and 6. A vacuum gage (gauge) and a mass flow controller of which sensitivities are adjusted to Ne have been used. These results are obtained when a film is deposited to the film thickness of 200 mm at a substrate temperature of 200° C. (actual measured value immediately before starting the sputtering), a background pressure of $1\times10^{-4}$ Pa or below, and at a power density of 10 W/cm$^2$.

FIG. 6 indicates that the resistivity of the Cr film tends to decrease gradually when the pressure is lowered. The absolute values of resistivity in this investigation range are all small to a level around 20 μΩcm or below, because the power density has been increased by the use of the cluster-type sputtering apparatuses and the background pressure has been controlled to be lower.

FIG. 5 indicates that the film stress is lowered when the pressure is lowered. When the pressure decreases to 1.0 Pa or below, the film stress becomes equal to or lower than 300 MPa, and when the sputtering gas pressure is below 0.5 Pa, the stress is close to almost zero. It is also known that the change of the film stress is smaller with the change of pressure meaning that the process controllability is high. In other words, the change of properties obtained is small even if the pressure is fluctuated to some extent. Although not shown in FIG. 6, it has been made clear that at a pressure of 0.5 Pa, by adjusting the substrate temperature the resistivity is decreased but the film stress is little changed and that when the power density is lowered, both the resistivity and the film stress increase. When the power density is controlled to be equal to or higher than 10 W/cm$^2$, the film stress to be described later can be set to a required level of 200 MPa or lower over almost the whole range of the investigation. When the background pressure is increased, the resistivity increases although there is almost no change in the stress. Therefore, it is necessary that the background pressure is set to 1×10$^{-4}$ or lower. Although not shown in the drawing, it is also possible to lower the stress in Cr films by increasing the density of Ne gas when a mixture gas of Ar and Ne is used.

The reasons why the Cr film stress changes when the gas pressure and the kind of gas are changed are following. When the sputtering gas pressure is lowered, the mean free path length becomes longer and the number of collision between the sputtered particles (Cr) and the sputtering gas (Ar or Ne) is reduced, so that the energy of sputtered particles incident to the substrate increases. When the sputtering gas is changed from an Ar gas to a Ne gas which has lower atomic mass, the energy loss at the time of a collision between the sputtered particles (Cr) and the sputtering gas (Ne) is reduced. Therefore, the energy of the Cr particles reaching the substrate increases. When the energy of the Cr particles reaching the substrate increases, the impingement of Cr particles results in an effect to enlarge the crystal lattice of Cr by a peening effect. Namely, it is considered that this causes a compressive stress. Consequently, since the Cr film has essentially a large tensile stress, the tensile stress of the films is relaxed. In this case, Ne atom which is the sputtering gas is taken into the grain boundaries at the time of the deposition of the Cr film. This means that an inert gas of He which is lighter atom has the same effect. Since He is too light, this has a problem that its sputtering rate is extremely slow.

Figure 8:
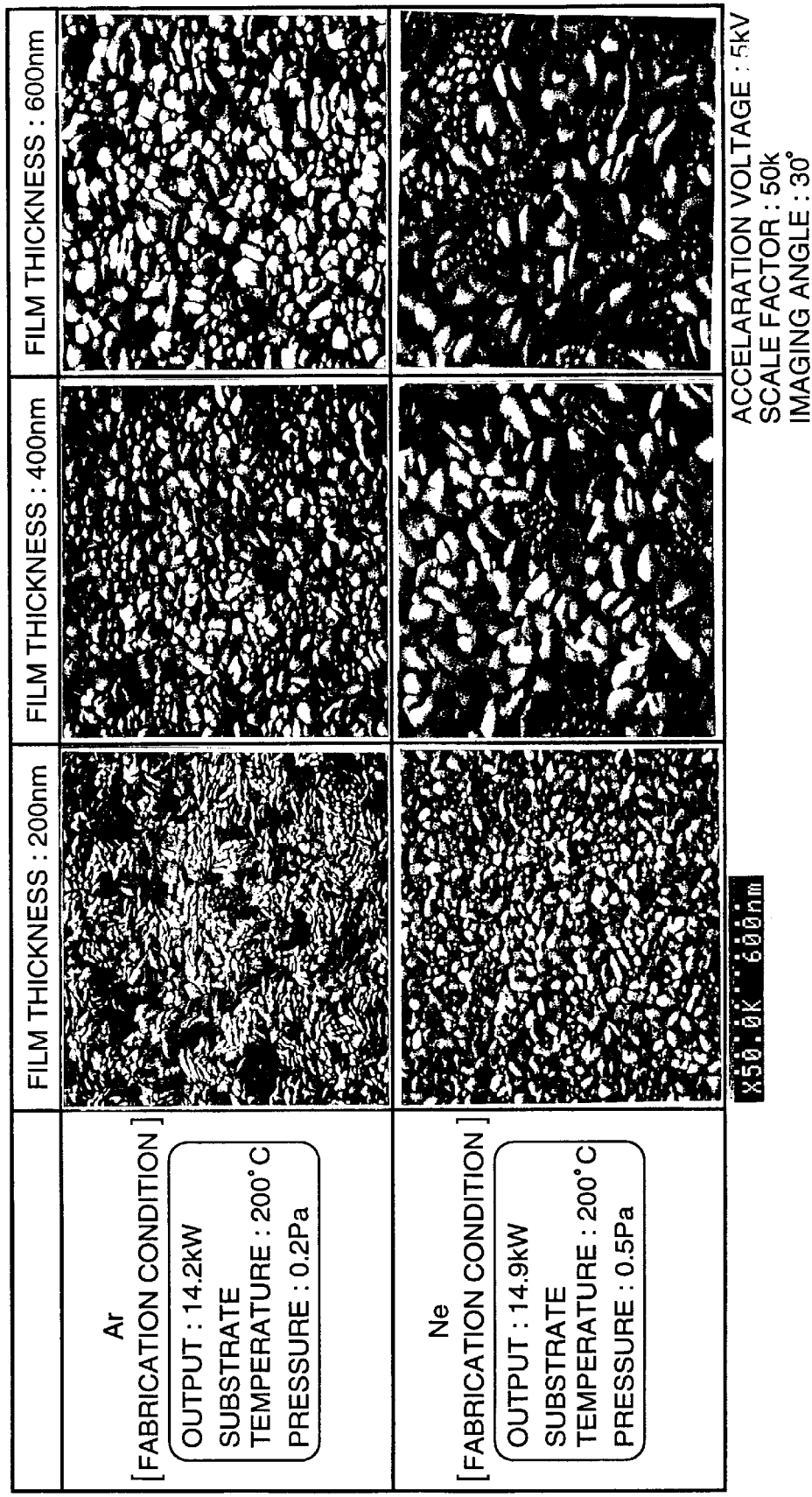
FIG. 8 is photographs of the surfaces of Cr films taken by a scanning electron microscope.
Figure 9:
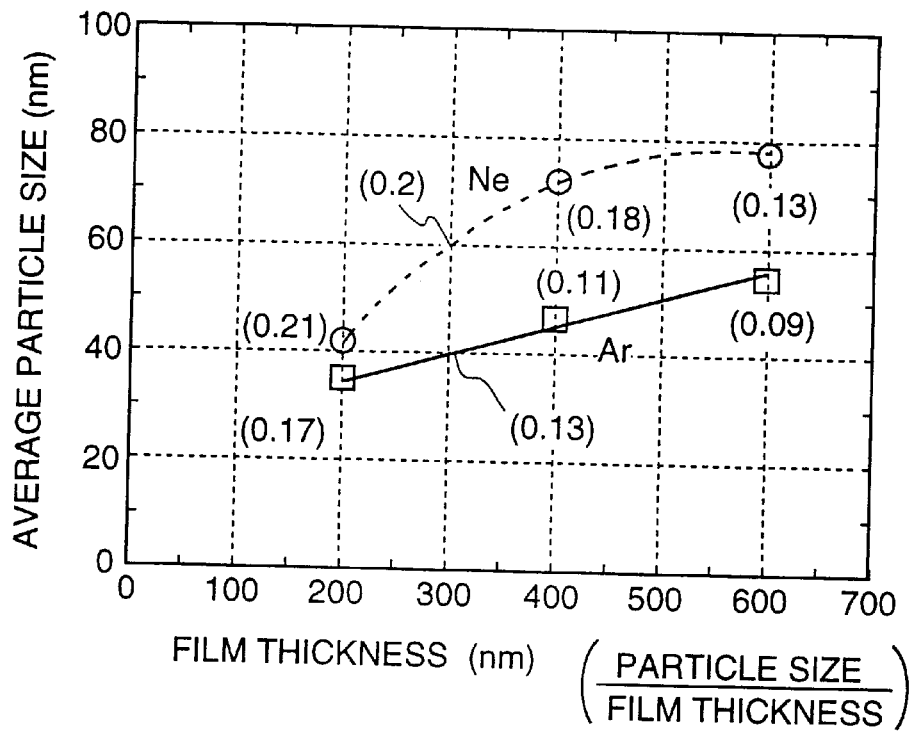
FIG. 9 is a characteristic diagram for showing a relationship between a film thickness and an average grain size.

A result of checking the characteristics of the structure of a film sputtered by using Ne gas will be shown. A film fabricated by using Ar is also shown for comparison. Both Ar and Ne have been sputtered under the condition that the stress becomes the lowest. Three kinds of film thickness of 200, 400 and 600 nm have been examined. A result of observation of the surface of each Cr film by a scanning electron microscope (SEM) is shown in FIG. 8. The observation has been carried out under the conditions of an acceleration voltage 5 kV and a scale factor 50 thousand times. The diagram indicates that in the case of Ne grain sizes are larger than the case of Ar at any film thickness. For a quantitative comparison, average crystal grain sizes are measured from photographs in FIG. 8 and are shown in FIG. 9. The diagram indicates that the grain sizes of the films sputtered by Ne are larger than those by Ar and that the grain sizes increase with an increase in the film thickness. Numerals in parentheses in FIG. 9 indicate ratios of grain sizes to film thickness. It can be known that the values of these ratios for Ne are larger than those for Ar and that the ratio for Ne is 0.18 or above, though the highest value for Ar is 0.17 in the film thickness range of 200 to 400 nm which is generally used for the TFT-LCD.

Figure 10:
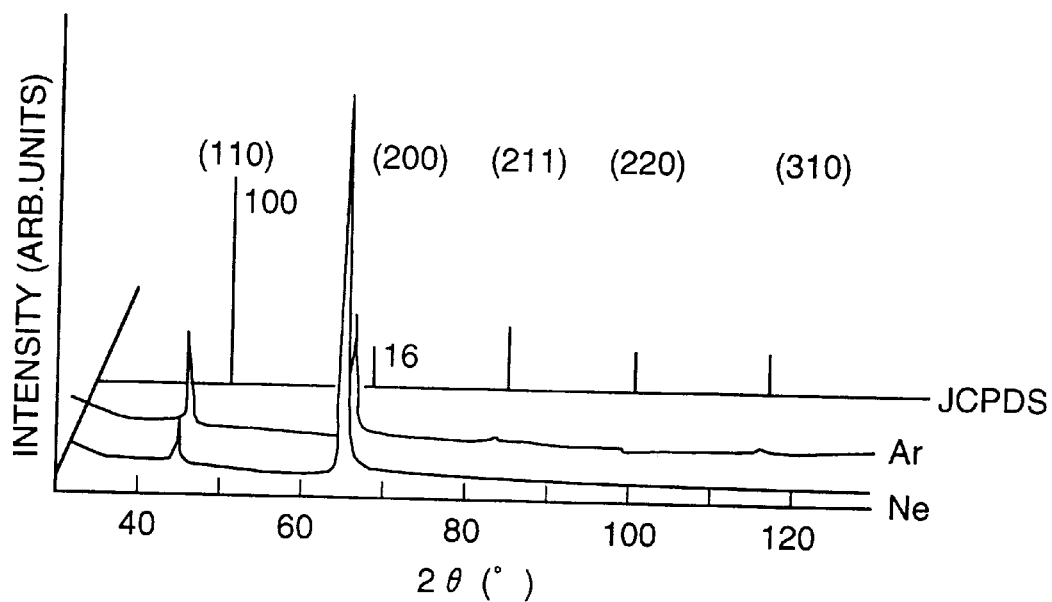
FIG. 10 is a diagram for showing an X-ray diffraction pattern of the Cr film.

Both films of 200 nm thickness have been evaluated by X-ray diffraction. To be more specific, these films are the Cr film of which stress by Ar sputtering is approximately 800 MPa and the Cr film of which stress by Ne sputtering is approximately 100 MPa. The measured X-ray diffraction patterns and the standard powder pattern of JCPDS are shown in FIG. 10. The diagram indicates that in the case of the low-stress Cr film, the (200) diffraction line is very strong as compared with the (110) diffraction line. While the diffraction intensity ratio of (200) to (110) is 0.16 in the case of the standard powder pattern, the same ratio for the Ne film is as large as approximately 10. This ratio is approximately 1.5 in the case of Ar. As a result of investigating the sputtering conditions over a wide range, it is possible to change this ratio to some extent. When Ar is used, it has been difficult to change this ratio to approximately 1.5 or above. The fact that the diffraction intensity of the (200) plane is high indicates that the film has a (200) preffered orientation. In other words, it indicates a fact that the ratio of the existence of grains of which (200) plane of Cr, that has a body-centered cubic structure, faces to a direction perpendicular to the film plane is high. It is also estimated that the film stress is relaxed because of the (200) preffered orientation of the film. In other words, the fact that the film has (200) preffered orientation and the ratio of diffraction intensity of (200) to (110) obtained by the X-ray diffraction is high shows that the film stress is low. As a result of the investigation, it has been concluded that the diffraction intensity ratio of (200) to (110) is 2.0 or above is the condition for low stress (<500 MPa).

As a result of a detailed evaluation of the films by the X-ray diffraction method, it has been made clear that a film of low stress has its lattice constant extended (in a direction perpendicular to the film) as compared with a film of high stress. In the case of the above-described two kinds of films, the result shows that the lattice constant of Ne films is 0.003 angstrom longer than that of Ar films.

The fact that Ne is included in the Cr film when the Cr film is sputtered by using an Ne gas can be made clear easily when an analysis method of a kind of composition analysis is used.

For example, when thermal desorption spectroscopy (TDS) is used, the mass of a desorption gas discharged from a sample when it is heated by raising the temperature (up to 900° C. in this case, with a maximum of 1,000° C.) in high vacuum can be analyzed. When an X-ray microprobe analyzer (XMA) is used, an electron of high energy is collided against a sample, and when an Auger electron and a characteristic X-ray which are own to the element structuring a solid are discharged from this sample by the collision, the wave length and intensity of the characteristic X-ray are measured and the element of the sample can be analyzed from this result. When a secondary ion mass spectrometer (SIM) is used, an ion beam is irradiated onto a sample and the mass of a secondary ion discharged by this irradiation of the ion beam can be analyzed. As a result of carrying out an analysis of the composition by using these analysis methods, according to the Ar sputtering, the quantity of Ar in the Cr film obtained has been 0.02 atom % when the formed film pressure is 2 Pa and 0.03 atom % when the formed film pressure is reduced to 0.2 Pa.

On the other hand, according to the Ne sputtering, the obtained Ne quantities have been 0.2 atom % and 0.8 atom % when the formed film pressures are 1 Pa and 0.5 Pa respectively. This indicates that the above-described film stress is obtained when a certain quantity of Ne atom is included in the Cr film.

A relationship between the bending of a substrate and the film resistance will be explained next.

As explained above, in order to restrict a signal delay which occurs along with an increase in the screen diagonal size and an increase in the resolution of a display unit, a lower resistance of the line becomes necessary. As a result of carrying out a simulation for obtaining a gate line resistance which are necessary for realizing a TFT-LCD with a screen diagonal size of 14 inches and with the number of pixels 1,024×768, it has been made clear that the sheet resistance of the line needs to be 0.7 Ω/□ or below.

The maximum 14 inch size has been considered on the grounds that six planes of 12-inch panels and four planes of 14-inch panels can be obtained from a substrate of 650 mm×550 mm size, and that the 14-inch panel corresponds to approximately 17-inch screen of a CRT monitor and is of high demand. Namely, in the same fabrication line, it is necessary to fabricate a plurality of panels from substrates of the same size, and also it is most desirable, from the viewpoint of efficiency, to be able to fabricate panels of all the same size from the same material and by the same process. In this case, it is sufficient to consider the screen size of 14 inches (number of pixels: 1,024×768) as a maximum size.

Figure 7:
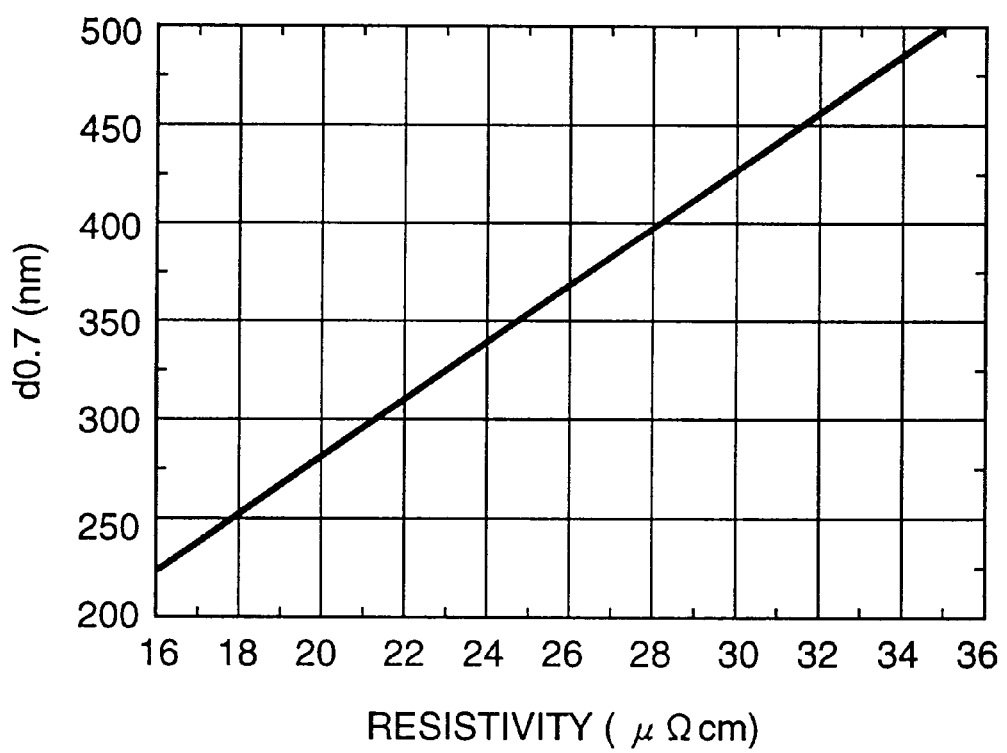
FIG. 7 is a characteristic diagram for showing a relationship between resistivity and a film thickness at which a sheet resistance of 0.7 $\Omega/\square$, is obtained.

A relationship between the resistivity of films and the film thickness d 0.7 at which the sheet resistance of 0.7 Ω/□ can be obtained is shown in FIG. 7. FIG. 7 indicates that the film thickness at which the sheet resistance can be adjusted at 0.7 Ω/□ becomes thinner when the resistivity is lowered. When Ar is used as the sputtering gas, the film thickness becomes 400 mm or above in order to have a sheet resistance of 0.7 Ω/□ because the resistivity of the Cr film is as high as 30 $\mu\Omega$cm or above. Therefore, it takes time for the deposition of films and for the etching of the films, with a resultant reduction in the throughput and an increase in the bending of the substrate due to the film stress. Thus, the production of TFT-LCD panels has not been able to be achieved when Ar was used as the sputtering gas.

When the film stress is constant, there is a problem that the bending quantity of the substrate increases with an increase in the film thickness. In actual practice, the film stress is almost constant when the film thickness is 150 nm or larger. The relationship between the film thickness, the film stress and the bending quantity of the substrate can be quantified from the above-described expression (1). According to an actual measuring, it has been made known that the number of troubles in the transfer, exposure and developing processes starts increasing when the bending quantity of the substrate is approximately 2 mm. From this fact, it can be said that the film should have a stress value at which the bending quantity of the substrate can be restricted to 2 mm or below.

FIG. 7 indicates that when the resistivity is 22 $\mu\Omega$cm, for example, the film thickness at which the sheet resistance of 0.7 Ω/□ is obtained is 314 nm. In this case, if the film stress is not restricted to approximately 400 Mpa or below from the expression (1), the bending of the substrate of 370 mm×470 mm×0.7 mm sizes becomes 2 mm or above. In the case of the substrate of the sizes 550 mm×650 mm×0.7 mm, it is necessary to set the film stress to 200 MPa or below from the expression (1). On the contrary, when the film stress is increased to approximately 300 MPa, in the case of the substrate of the sizes 550 mm×650 mm×0.7 mm, the film thickness at which the substrate bending quantity can be restricted to 2 mm or below is 250 nm. When the film stress value is constant, the bending quantity of the substrate becomes smaller in inverse proportion to the thickness of the substrate. According to an actual experiment, when the substrate thickness becomes 1.0 mm or above, the number of troubles due the bending of the substrate decreased rapidly.

Taking the above into consideration, the film thickness of the Cr film required from the throughput of the film deposition and film etching processes is approximately 300 nm. Accordingly, FIG. 7 indicates that the resistivity needs to be 22 $\mu\Omega$cm or below. It is also possible to lower the resistivity by such methods as raising the temperature of the substrate or lowering the background pressure. However, the use of each of these method tends to lower the throughput, and therefore, approximately 18 $\mu\Omega$cm is considered to the lowest limit in the actual fabrication process. It has been confirmed that the etching speed of the Ne-sputtered Cr film is almost equivalent to the etching speed of the Ar-sputtered Cr film. In other words, there has been no reduction in the throughput in the film etching process.

A result of the fabrication of a TFT substrate based on the above-described outcome will be explained below.

At first, a glass substrate sufficiently cleaned is heated to 200° C. and Cr is deposited onto this glass substrate. The deposition conditions are set within the above-described range. The film thickness is set to 250 nm and the sheet resistance is 0.8 Ω/□. The Cr film is processed into the gate line 12 by photo-etching. In this case, an addition of nitric acid to a solution of secondary cerium ammonium nitride with perchloric acid has been used as an etchant for the etching. A tapered angle can be controlled by the concentration of secondary cerium ammonium nitride and the addition quantity of nitric acid. In this case, the tapered angle of the end portion of the Cr gate electrode was 45°. With this tapered angle, the step-coverage of films to be deposited onto the gate line can be made satisfactory. The tapered angle of the gate electrode and the step-coverage of an insulator (SiN) formed on this have been checked by a preliminary investigation. More specifically, the tapered angle has been adjusted within a range of 10 to 80° and an SiN film and subsequently a Cr film have been formed respectively on this tapered angle to fabricate an MIM device, and the dielectric strength of the SiN film has been measured. As a result, it has been known that when the tapered angle exceeds 60°, the number of devices with lower dielectric strength tends to increase. The gate line 12 can also be etched with a mixture gas of $Cl_2$ and $O_2$ by a dry-etching method and the tapered angle can be controlled by a flow rate between $Cl_2$ and $O_2$.

A substrate processed by the gate line 12 was installed in a RF plasma CVD unit and SiN of the gate insulator 26 was formed. The substrate temperature was set to 280° C. and a mixture of $SiH_4$, $NH_3$ and $N_2$ gases was used as a raw material gas to form a film thickness of 300 nm. Next, a-Si of a semiconductor layer was formed in a separate chamber within the RF plasma CVD unit. In this case, the substrate temperature was set to 250° C. and monosilane $SiH_4$ was used as a raw material gas. The film thickness was set to 220 nm. Then, the substrate was transferred to a separate chamber and phosphorus (P)-doped n+.a-Si layer 28 was formed on this. The substrate temperature was set to 230° C. and a mixture gas of $SiH_4$, $PH_3$ and $H_2$ was used to form a film thickness of 50 nm.

The n+.a-Si layer 28 and the semiconductor layer a-Si 24 was patterned in the TFT shape by the dry etching method. Then, the gate insulator 26 was processed by the dry-etching method in a similar manner, and a through-hole for a terminal take-out section of the pixel electrode 16 and the gate electrode 18 was formed. On this portion, a Cr film was deposited by using the same material, the same unit and under the same condition as those of the gate electrode 18. This Cr film was photo-etched in a same manner as that of the gate line 18 to form the drain line 14.(20) and the source alactivde 22. Then, the n+.a-Si layer 28 was removed by the photo-etching method to form a channel of the TFT. In actual practice, according to the dry-etching method, not only the n+.a-Si layer 28 is etched by 50 mm but also the semi-conductor layer 24 is also over-etched by approximately 100 nm by taking the processing allowance into account. Next, by using the DC magnetron sputtering method, a transparent electrode ITO film was deposited at a substrate temperature of 200° C. and then the pixel electrode 16 was patterned by photo-etching. Although not shown in FIG. 1, by this patterning step, the gate electrode 18, the source electrode 22 and the drain electrode 20 on the peripheral area of the panel are also covered by the ITO film in order to obtain a reliable connection between those electrodes and the panel driving circuit (external driving circuit). Further, on this, a SiN film of the passivation film 30 was formed by the RF plasma CVD method. Here, with the substrate temperature set at 250° C., a mixture gas of $SiH_4$, $NH_3$ and $H_2$ was used as a raw material gas to form a film thickness of 300 nm. Thereafter, by the dry-etching method, the passivation insulator SiN around the panel was removed to expose the terminal electrodes and a through-hole was formed in the pixel electrode section.

In the above-described processes, when Ne was used as the sputtering gas to form a Cr film, there has been no occurrence of such inconvenience as a cracking of the substrate and a pealing-off of the film in the fabrication process. Then, a part of the fabricated TFT substrate was put into the liquid crystal process to complete an LCD panel. As a result of checking display characteristics, it has been confirmed that no pixel faults occurred at all. This indicates that there is no disconnection in the gate line 12 and the drain line 14 and that the contact between the lines and the transparent electrode ITO film is satisfactory. On the other hand, according to the conventional method using Ar as the sputtering gas, a transfer trouble already occurred in the gate line deposition process. Therefore, the subsequent processes were stopped in anticipation of an occurrence of cracking in the substrate.

As explained above, according to the present invention, since the signal transmission path, scanning line or data signal line is formed by a metal film including Ne atom in the Cr film and also since the resistivity of this metal film is not higher than 22 $\mu\Omega$cm and the absolute value of the film stress is set at a level not higher than 200 MPa, the resistivity of the elements for transmitting signals and the film stress can be made smaller. Therefore, the present invention can contribute to the improvement in the throughput and the improvement in the reliability.

What is claimed is:

1. An active-matrix liquid crystal display unit, comprising:
    a liquid crystal layer including a liquid crystal material for forming a plurality of pixels;
    a pair of insulating substrates oppositely disposed to sandwich said liquid crystal layer therebetween, with at least one of these insulating substrates being transparent;
    a plurality of scanning lines disposed on one of said pair of insulating substrates; and
    a plurality of data signal lines disposed to cross in a matrix shape with said plurality of scanning lines, wherein in a plurality of display areas encircled by said plurality of scanning lines and said plurality of data signal lines, there are provided auxiliary electrodes to be supplied with a liquid crystal driving voltage and semiconductor active elements for driving said pixels connected to said scanning lines and said data signal lines; and wherein
    an element for constituting a signal transmission path for transmitting an electrical signal relevant to the driving of said semiconductor active elements for driving said pixels is structured by a metal film of Cr containing Ne atoms, with the resistivity of said metal film being equal to or lower than 22 $\mu\Omega$cm and with an absolute value of the film stress of said metal film being equal to or lower than 200 MPa.

2. An active-matrix liquid crystal display unit according to claim 1, wherein the edges of said metal film are formed to be tapered at an angle of 60° or smaller.

3. An active-matrix liquid crystal display unit according to claim 1, wherein the film thickness of said metal film is equal to or larger than 250 nm.

4. An active-matrix liquid crystal display unit, comprising:
    a liquid crystal layer including a crystal layer for forming a plurality of pixels;
    a pair of insulative substrates oppositely disposed to sandwich said liquid crystal layer therebetween, with at least one of these insulative substrates being transparent;
    a plurality of scanning lines disposed on one of said pair of insulative substrates and a plurality of data signal lines disposed to cross in a matrix shape with said plurality of scanning lines, wherein, in a plurality of display areas encircled by said plurality of scanning lines and said plurality of data signal lines, there are provided auxiliary electrodes to be supplied with a liquid crystal driving voltage and semiconductor active elements for driving said pixels connected to said scanning lines and said data signal lines; wherein
    at least one of said scanning lines and said data signal lines are formed of a metal film of Cr containing Ne atoms, with the resistivity of said metal film being equal to or lower than 22 $\mu\Omega$cm and an absolute value of film stress of said metal film being equal to or lower than 200 MPa.

5. An active-matrix liquid crystal display unit according to claim 4, wherein the edges of said lines are formed with a taper.

6. An active-matrix liquid crystal display unit according to claim 4, wherein the film thickness of said metal film is equal to or above 250 nm.

7. An active-matrix liquid crystal display unit, comprising:
    a liquid crystal layer including a crystal liquid for forming a plurality of pixels;
    a pair of insulation substrates oppositely disposed to sandwich said liquid crystal layer therebetween, with at least one of these insulation substrates being transparent; and
    a plurality of scanning lines disposed on one of said pair of insulation substrates and a plurality of data signal lines disposed to cross in a matrix shape with said plurality of scanning lines, wherein, in a plurality of display areas encircled by said plurality of scanning lines and said plurality of data signal lines, there are provided auxiliary electrodes to be supplied with a liquid crystal driving voltage and semiconductor active elements for driving said pixels connected to said scanning lines and said data signal lines; wherein an element for constituting a signal transmission path for transmitting an electrical signal relevant to the driving of a semiconductor active element for driving a pixel is a Cr film, and the film thickness of the Cr film is within a range from 200 nm to 400 nm, the ratio of an average crystal grain size to the film thickness viewed from a direction perpendicular to the film plane is equal to or larger than 0.18 and an X-ray diffraction intensity ratio of a (200) plane to a (110) plane of the film is equal to or larger than 2.

8. An active-matrix liquid crystal display unit according to claim 7, wherein the edges of said metal film are formed with a taper.

9. An active-matrix liquid crystal display unit according to claim 7, wherein the film thickness of said metal film is equal to or above 250 nm.

10. An active-matrix liquid crystal display unit, comprising:

a liquid crystal layer including a crystal liquid for structuring a plurality of pixels;

a pair of insulation substrates oppositely disposed to sandwich said liquid crystal layer therebetween, with at least one of these insulation substrates being transparent;

a plurality of scanning lines disposed in dispersion on one of said pair of insulation substrates; and a plurality of data signal lines disposed to cross in a matrix shape with said plurality of scanning lines, wherein, in a plurality of display areas encircled by said plurality of scanning lines and said plurality of data signal lines, there are provided auxiliary electrodes to be supplied with a liquid crystal driving voltage and semiconductor active elements for driving said pixels connected to said scanning lines and said data signal lines; wherein at least one of said scanning lines and said data signal lines are formed by a Cr film and the film thickness is within a range from 200 nm to 400 nm, the ratio of an average crystal grain size to the film thickness viewed from a direction perpendicular to the film plane is equal to or above 0.18 and an X-ray diffraction intensity ratio of a (200) plane to a (110) plane of the film is equal to or above 2.

11. An active-matrix liquid crystal display unit according to claim 10, wherein an end portion of said metal film is formed with a tapered section of 60° or below.

12. An active-matrix liquid crystal display unit according to claim 10, wherein the film thickness of said metal film is equal to or above 250 nm.

13. A method of fabricating an active-matrix liquid crystal display unit including auxiliary electrodes to be supplied with a liquid crystal driving voltage and semiconductor active elements for driving said pixels connected to said scanning lines and said data signal lines, in a plurality of display areas encircled by said plurality of scanning lines and said plurality of data signal lines, wherein Cr is used as a main material of elements for constituting a signal transmission path for transmitting electrical signals relevant to the driving of semiconductor active elements for driving said pixels, the method comprising the steps of inserting Cr as a cathode target into a sputtering gas including Ne as an inert gas or a mixture gas of Ar and Ne, to form a metal film including Ne atom in a Cr film formed by a DC magnetron sputtering method, such that the resistivity of this metal film is equal to or lower than 22 $\mu\Omega$cm and an absolute vale of the film stress of said metal film is equal to or lower than 200 MPa.

14. A method of fabricating an active-matrix liquid crystal display unit according to claim 13, wherein a background pressure is set to be equal to or lower than $1\times1.0^{-4}$ Pa, a gas pressure of said sputtering gas is set at a value between 0.4 and 1.0 Pa and a power density is set to be equal to or above 10 W/cm$^2$ to thereby deposit said Cr film.

15. A method of fabricating an active-matrix liquid crystal display unit including auxiliary electrodes to be supplied with a liquid crystal driving voltage and semiconductor active elements for driving said pixels connected to said scanning lines and said data signal lines, in a plurality of display areas encircled by said plurality of scanning lines and said plurality of data signal lines, the method comprising the steps of: inserting Cr as a main material of at least one of said scanning lines and said data signal lines into a sputtering gas including Ne as an inert gas or a mixture gas of Ar and Ne by providing the Cr as a cathode target, to form a metal film by a DC magnetron sputtering method, to a film thickness within a range from 200 nm to 400 nm, with a ratio of an average crystal grain size to the film thickness viewed from a direction perpendicular to the film plane which is equal to or higher than 0.18 and with an X-ray diffraction intensity ratio of a (200) plane to a (110) plane of a film which is equal to or higher than 2.

16. A method for fabricating an active-matrix liquid crystal display unit according to claim 15, wherein a background pressure is set to be equal to or lower than $1\times1.0^{-4}$ Pa, a gas pressure of said sputtering gas is set at a value between 0.4 and 1.0 Pa and a power density is set to be equal to or above 10 W/cm$^2$ to thereby deposit said Cr film.

* * * * *